United States Patent
Matsumoto et al.

(10) Patent No.: US 9,232,032 B2
(45) Date of Patent: Jan. 5, 2016

(54) ELECTRONIC DEVICE AND COMMUNICATION DEVICE

(75) Inventors: Takashi Matsumoto, Fuchu (JP); Tetsuya Hori, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 272 days.

(21) Appl. No.: 13/420,415

(22) Filed: Mar. 14, 2012

(65) Prior Publication Data

US 2012/0235898 A1 Sep. 20, 2012

(30) Foreign Application Priority Data

Mar. 18, 2011 (JP) .................................. 2011-061133

(51) Int. Cl.
| | | |
|---|---|---|
| H05K 7/00 | (2006.01) |
| H04M 1/02 | (2006.01) |
| H05K 5/00 | (2006.01) |
| G01J 1/04 | (2006.01) |
| H05K 1/18 | (2006.01) |
| G01J 1/42 | (2006.01) |

(52) U.S. Cl.
CPC ............ *H04M 1/0216* (2013.01); *G01J 1/0403* (2013.01); *G01J 1/4204* (2013.01); *H04M 1/021* (2013.01); *H04M 1/026* (2013.01); *H05K 1/181* (2013.01); *H05K 5/0013* (2013.01)

(58) Field of Classification Search
USPC ......... 361/679.01–679.29; 206/736; 248/328, 248/127; 349/56
See application file for complete search history.

(56) References Cited

U.S. PATENT DOCUMENTS

| 8,638,549 | B2 * | 1/2014 | Garelli et al. ............ 361/679.27 |
| 2006/0240778 | A1 * | 10/2006 | Yuki et al. .................... 455/41.2 |
| 2007/0019378 | A1 * | 1/2007 | Kwon ................. G02F 1/13452 361/679.21 |
| 2010/0048249 | A1 * | 2/2010 | Furuta et al. .................. 455/566 |
| 2010/0053861 | A1 * | 3/2010 | Kim et al. ................ 361/679.01 |
| 2013/0020747 | A1 * | 1/2013 | Kumagai ............ H04M 1/0214 267/141 |

FOREIGN PATENT DOCUMENTS

| JP | 2007-208338 A | 8/2007 |
| JP | 2009-288361 A | 12/2009 |

OTHER PUBLICATIONS

Machine translation of Japanese Publicaiton No. 2009288361 on Oct. 12, 2009 by Yoshihiro, Tsuda.*
Office Action of Japanese Patent Application No. 2011-061133 dated Jun. 24, 2014 with Partial Translation.

* cited by examiner

*Primary Examiner* — Linh N Hoffner
(74) *Attorney, Agent, or Firm* — Maschoff Brennan

(57) ABSTRACT

There is provided an electronic device which includes a display device, a case configured to retain the display device, a stopper disposed between the retained display device and the case, and a component arranged in a space formed by disposing the stopper. Further, there is provided an electronic device which includes a display device, a case including a first space for retaining the display device, the display device being operable to be slid into the first space, a stopper disposed in a second space between the retained display device and the case, and an electronic device arranged in a third space formed by arranging the stopper.

6 Claims, 7 Drawing Sheets

ELECTRONIC DEVICE AND COMMUNICATION DEVICE

CROSS-REFERENCE TO RELATED APPLICATION

This application is based upon and claims the benefit of priority of the prior Japanese Patent Application No. 2011-061133, filed on Mar. 18, 2011, the entire contents of which are incorporated herein by reference.

FIELD

The embodiments discussed herein are related to an electronic device and a communication device.

BACKGROUND

FIG. 10 is a sectional view illustrating a known electronic device. In the stage of manufacture of the known electronic device for fixing the a crystal display module 1 to a case 2, the liquid crystal display module 1 is bent and inserted so that the edges of the liquid crystal display module 1 are placed under retaining portions 3. Since the retaining portions 3 are formed so as to protrude inward from the edges of the case 2, the liquid crystal display module 1 is fitted into the case 2.

However, when the liquid crystal display module is bent, sometimes the liquid crystal display module breaks. There are electronic devices in which a liquid crystal display module may be attached to a case without being bent. For example, there is an electronic device in which a liquid crystal display module is attached to a case by being slid which has been disclosed in Japanese Laid-open Patent Publication No. 2007-208338.

SUMMARY

According to an aspect of the invention, an electronic device includes a display device, a case configured to retain the display device, a stopper disposed between the retained display device and the case, and a component arranged in a space formed by disposing the stopper.

According to another aspect of the invention, a communication device includes a display device, a case configured to retain the display device, a stopper disposed between the retained display device and the case, a component arranged in a space formed by disposing the stopper, a wireless communication circuit; and a data input device operable by a user, wherein the display device is operable to display information in accordance with data received by the wireless communication circuit and to display information in accordance with data inputted by the data input device.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Preliminary Consideration

Figure 1:
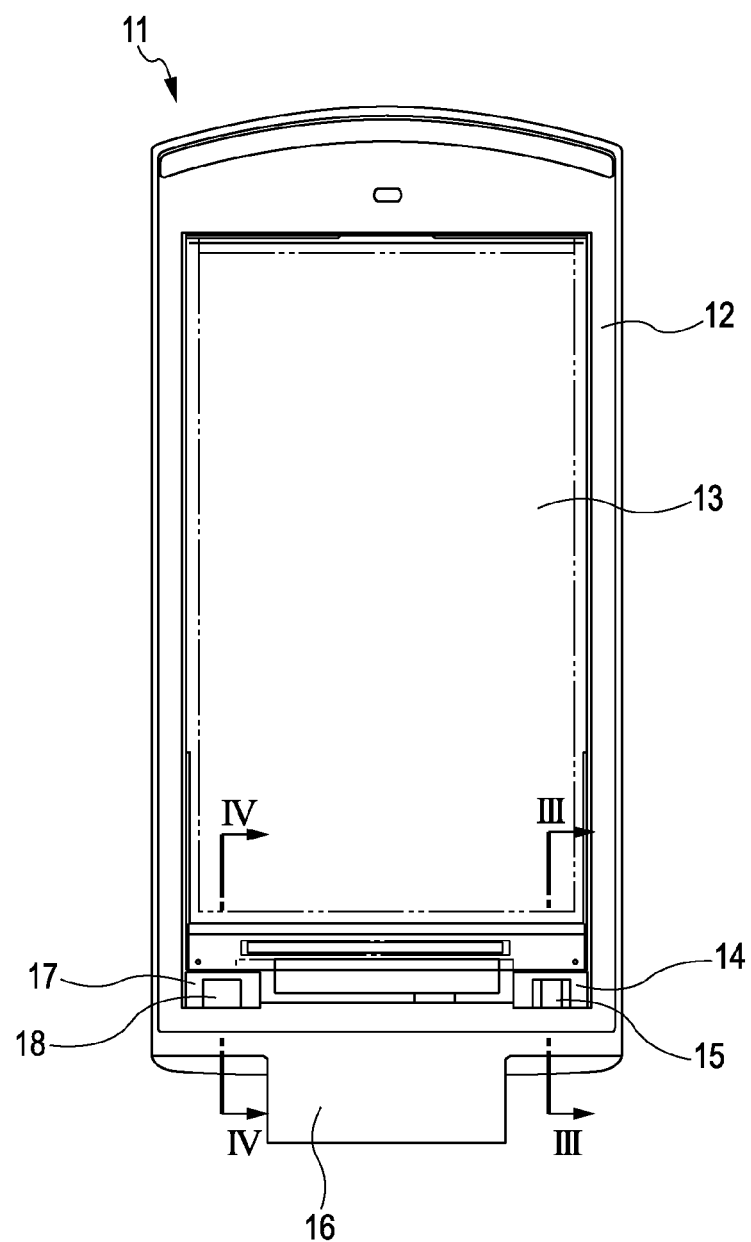
FIG. 1 is a front view illustrating an electronic device according to a first embodiment.

However, the known electronic device uses a stopper for suppressing backward sliding and detachment from the case of the liquid crystal display module attached by being slid. Providing such a stopper increases the size of the electronic device.

The preferred embodiments of this electronic device will now be described in detail with reference to the drawings. In the electronic device, a space formed between the edge of a display unit, which is slid and inserted into a case, and the edge of the case is filled with a stopper, and an electronic component is disposed in a space formed by the stopper. In the following description of each embodiment, the same reference numerals will be used to designate the same components, and redundant description will be omitted.

First Embodiment

FIG. 1 is a front view illustrating an electronic device according to a first embodiment. As illustrated in FIG. 1, the electronic device 11 has a case 12, a display unit 13, a stopper 14, and an electronic component 15. The case 12 holds the display unit 13. The display unit 13 is inserted into the case 12. The stopper 14 fills a space formed between the edge of the case 12 and the edge of the display unit 13 slid and inserted into the case 12. Since the stopper 14 is provided, the display unit 13 inserted into the case 12 does not slide backward and is not detached from the case 12. The electronic component 15 is disposed in the space formed by the stopper 14.

According to the first embodiment, compared to a case where the electronic component 15 is disposed away from the stopper 14, the installation space for the electronic component 15 is reduced, and thus the size of the electronic device 11 may be reduced.

Second Embodiment

Examples of an electronic device include a cellular phone. In a second embodiment, examples of a cellular phone include, but are not limited to a folding phone.

Figure 2:
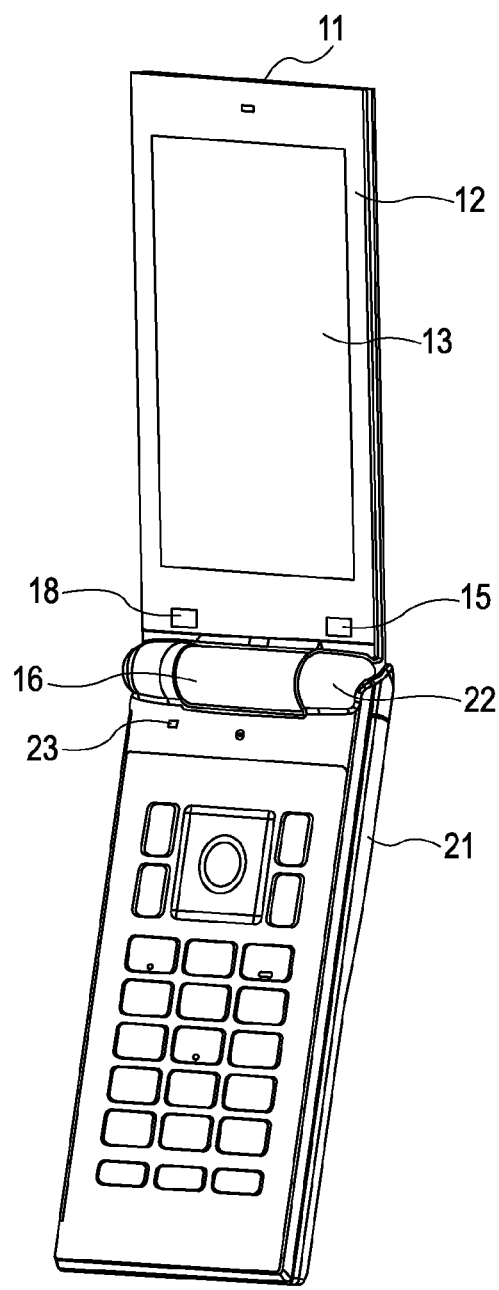
FIG. 2 is a perspective view illustrating an electronic device according to a second embodiment.

FIG. 2 is a perspective view illustrating an electronic device according to the second embodiment. As illustrated in FIG. 2, in a folding cellular phone, the electronic device 11 in the first embodiment is attached to a phone main body 21 superimposed onto the electronic device 11, by hinge portions 16 and 22 openably and closably. As the cellular phone, the electronic device 11 includes a circuit for communicating with another one and a data input device such as a data entry keyboard illustrated in FIG. 2.

The electronic component 15 may be, for example, a sensor that detects light. Examples of a sensor that detects light include an illuminance sensor. In the electronic device 11, a stopper 17 may be provided on the opposite side of the hinge portion 16 from the stopper 14. The stopper 17 fills a space formed between the edge of the display unit 13 and the edge of the case 12.

The display unit 13 in the first embodiment includes a liquid crystal display module that has liquid crystal cells operating as shutters and a drive circuit applying a drive voltage to the liquid crystal cells. The stoppers 14 and 17 fill the spaces formed between the edge of the liquid crystal display module and the edge of the case 12.

An electronic component 18 may be disposed in a space formed by the stopper 17. Examples of the electronic component 18 include a magnet. Examples of the electronic components 15 and 18 are not limited to an illuminance sensor and a magnet.

A magnetic sensor 23 may be disposed at a position on the phone main body 21 facing the electronic component 18 (magnet), when the cellular phone is closed, that is to say, when the electronic device 11 and the phone main body 21 are superimposed on each other. The magnetic sensor 23 detects lines of magnetic force emanating from of the electronic component 18 (magnet), and thereby the cellular phone may recognize its own open/closed state.

In FIG. 1, a decorative panel that covers the surface of the liquid crystal display module is omitted. The edge of the liquid crystal display module, the stoppers 14 and 17, and the electronic components 15 and 18 are covered by the decorative panel (not illustrated) and invisible from the front of the electronic device 11.

Figure 3:
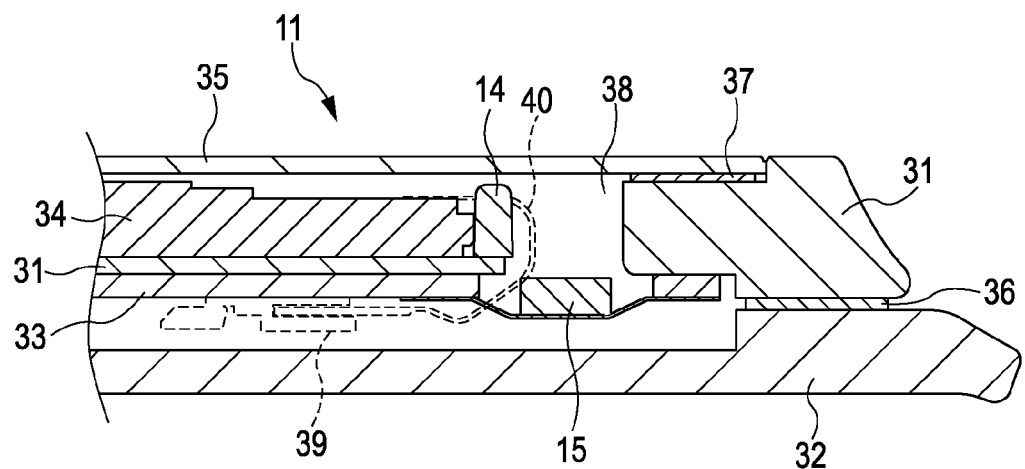
FIG. 3 is a partial sectional view taken along line III-III of FIG. 1.

FIG. 3 is a partial sectional view taken along line III-III of FIG. 1. The cutting plane passing through line III-III passes through the electronic component 15 (illuminance sensor). As illustrated in FIG. 3, a board 33, the electronic component 15 (illuminance sensor), the stopper 14, and a liquid crystal display module 34 are housed, for example, in a recess of a case formed by integrating a front case 31 and a rear case 32. The front case 31 is covered by a decorative panel 35.

The gap between the front case 31 and the rear case 32 may be kept watertight, for example, by a sealing member 36. The gap between the front case 31 and the decorative panel 35 may be kept watertight, for example, by a sealing member 37.

The stopper 14 may be fixed to the bottom plate portion of the front case 31, for example, with double-sided adhesive tape or glue. The stopper 14 is in contact with the edge of the liquid crystal display module 34, and holds the liquid crystal display module 34 so that it does not move. The stopper 14 may have, for example, such a shape that the electronic component 15 (illuminance sensor) is surrounded on its three sides by the stopper 14 as viewed from the front (see FIG. 1 and FIG. 7). The electronic component 15 (illuminance sensor) is disposed in a space 38 surrounded on all four sides by the stopper 14 and the edge of the front case 31.

Depending on the size of the liquid crystal display module 34 and the positional relationship between the liquid crystal display module 34 and the illuminance sensor, the stopper 14 does not necessarily have to have such a shape that the illuminance sensor is surrounded on its three sides by the stopper 14. If leakage of light from the liquid crystal display module 34 into the illuminance sensor may be suppressed, the stopper 14 may be a plate that fills the gap between the liquid crystal display module 34 and the illuminance sensor.

The stopper 14 may be lightproof. For example, the stopper 14 may be colored with a color impervious to light, for example, a deep color such as black. For example, the stopper 14 may be made of a material such as a resin with a color impervious to light. In that case, leakage of light from the liquid crystal display module 34 into the electronic component 15 (illuminance sensor) may be suppressed.

The edge of the front case 31 may be colored with a color impervious to light, or may be made of a material such as a resin with a color impervious to light. In that case, entrance of light into the space 38 surrounded on all four sides by the stopper 14 and the edge of the front case 31 may be further suppressed, and therefore leakage of light into the electronic component 15 (illuminance sensor) may be further suppressed.

The space 38 surrounded on all four sides by the stopper 14 and the edge of the front case 31 appears owing to the sliding of the liquid crystal display module 34 at the time of assembling described later. Therefore, this space 38 has such a margin that the liquid crystal display module 34 may be slid and attached to the front case 31. This space 38 may be used as a space through which, for example, a flexible board 40 is passed that electrically connects an electronic component 39 attached, for example, to the back of the board 33 and the liquid crystal display module 34 attached, for example, to the face of the board 33.

Figure 4:
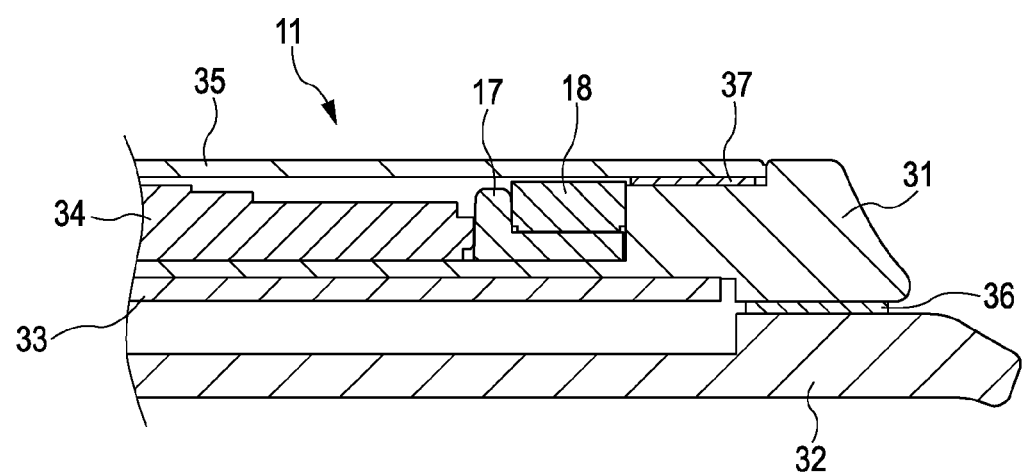
FIG. 4 is a partial sectional view taken along line IV-IV of FIG. 1.
Figure 5:
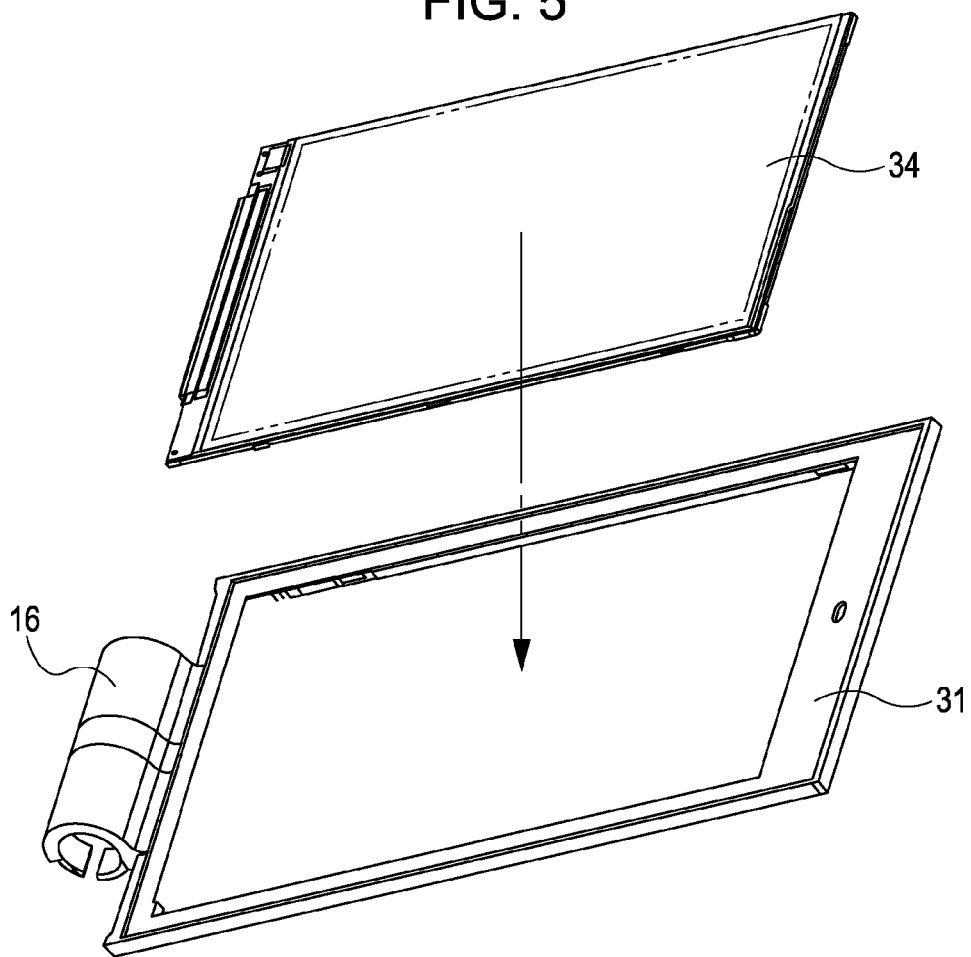
FIG. 5 is a perspective view illustrating the electronic device according to the first embodiment being assembled.

FIG. 4 is a partial sectional view taken along line IV-IV of FIG. 1. The cutting plane passing through line IV-IV passes through the electronic component 18 (magnet). As illustrated in FIG. 4, for example, the electronic component 18 (magnet) and the stopper 17 are housed in a recess of the case formed by integrating the front case 31 and the rear case 32.

The stopper 17 may be fixed to the bottom plate portion of the front case 31, for example, with double-sided adhesive tape or glue. The stopper 17 is in contact with the edge of the liquid crystal display module 34, and holds the liquid crystal display module 34 so that it does not move. The stopper 17 may have, for example, such a shape that the electronic component 18 (magnet) is surrounded on its three sides by the stopper 17 as viewed from the front (see FIG. 1 and FIG. 7).

The stopper 17 may have a bottom portion in contact with the lower surface of the electronic component 18 (magnet). The electronic component 18 (magnet) is disposed in a space surrounded on all four sides by the stopper 17 and the edge of the front case 31. The stopper 17 may be used to determine the position where the electronic component 18 (magnet) is attached.

In the case where the electronic component 18 is a magnet, the stopper 17 does not necessarily have to have such a shape that the magnet is surrounded on its three sides by the stopper 17, and the stopper 17 does not necessarily have to be provided between the liquid crystal display module 34 and the magnet. The magnet may be placed anywhere as long as the magnet is placed within a space into which the liquid crystal display module 34 may be inserted and to which a stopper is not attached.

As with the above-described space 38, the space surrounded on all four sides by the stopper 17 and the edge of the front case 31 may have such a margin that the liquid crystal display module 34 may be slid, or such a margin that the space may be used as a space through which, for example, the flexible board 40 is passed.

FIG. 5 to FIG. 9 are perspective views illustrating in sequence the assembling of the electronic device according to the first embodiment. In the process of assembling the electronic device 11, first, as illustrated by arrow in FIG. 5, the liquid crystal display module 34 is pressed against the front case 31 from the front of the front case 31. At that time, the liquid crystal display module 34 is moved to the hinge portion 16 side.

Figure 6:
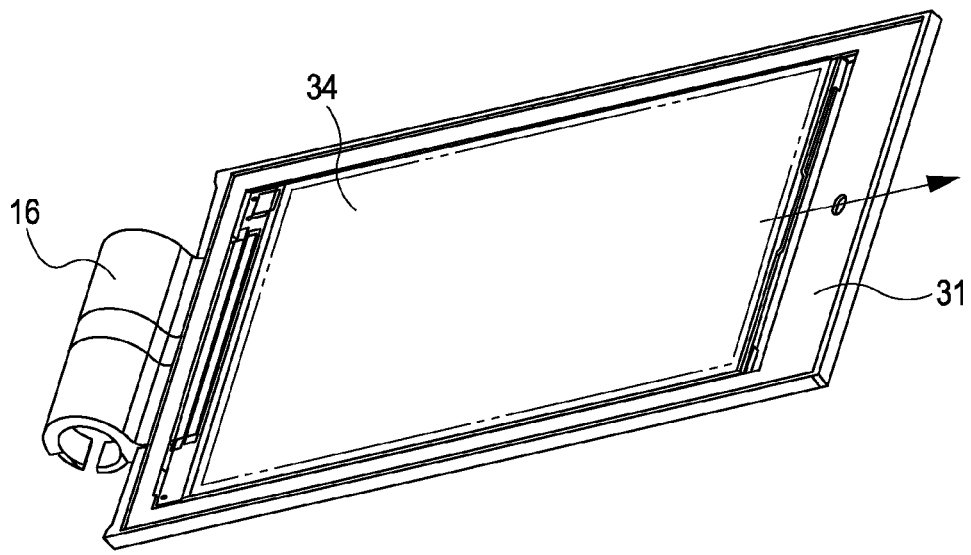
FIG. 6 is a perspective view illustrating the electronic device according to the first embodiment being assembled.

Next, as illustrated by arrow in FIG. 6, the liquid crystal display module 34 pressed against the front case 31 is slid away from the hinge portion 16. On the edge of the front case 31 opposite from the hinge portion 16 or in the proximity thereof, a detachment-suppressing protrusion (not illustrated) protruding inward from the edge is provided.

By sliding the liquid crystal display module 34, the upper end portion of the liquid crystal display module 34 is inserted under the detachment-suppressing protrusion of the front case 31. Therefore, the above-described margin of the space 38 surrounded on all four sides by the stopper 14 and the edge of the front case 31 is such a margin that the upper end portion of the liquid crystal display module 34 may avoid the detachment-suppressing protrusion of the front case 31.

Figure 7:
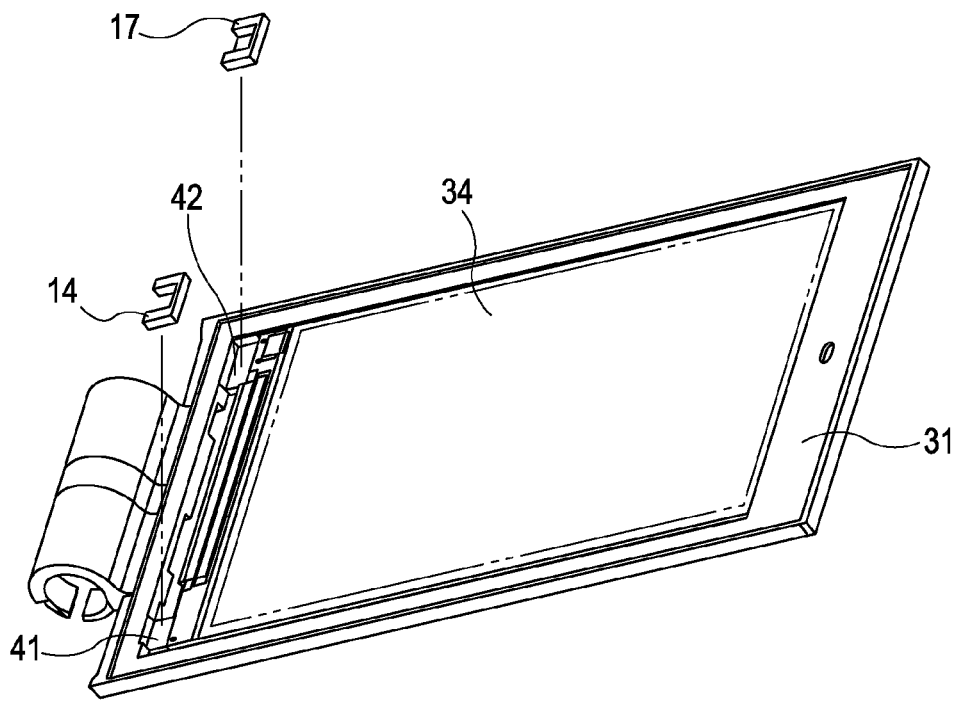
FIG. 7 is a perspective view illustrating the electronic device according to the first embodiment being assembled.
Figure 8:
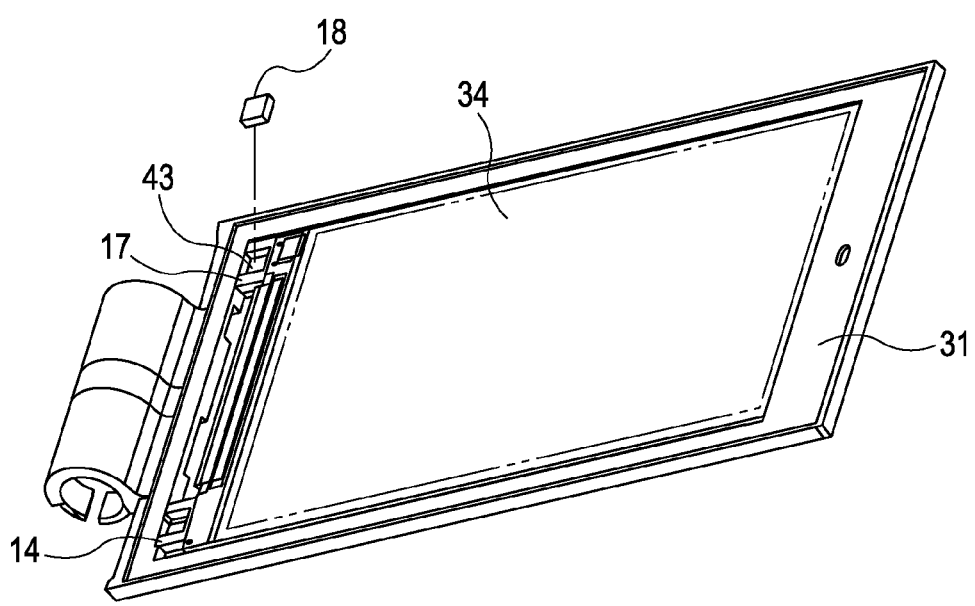
FIG. 8 is a perspective view illustrating the electronic device according to the first embodiment being assembled.

Next, as illustrated in FIG. 7, the stoppers 14 and 17 are attached to the spaces 41 and 42 between the liquid crystal display module 34 and the front case 31 that appear owing to the sliding of the liquid crystal display module 34. Thus, the liquid crystal display module 34 is fixed so as not to move. Next, as illustrated in FIG. 8, the electronic component 18 (magnet) is attached to the space 43 surrounded on all four sides by the stopper 17 and the edge of the front case 31.

Figure 9:
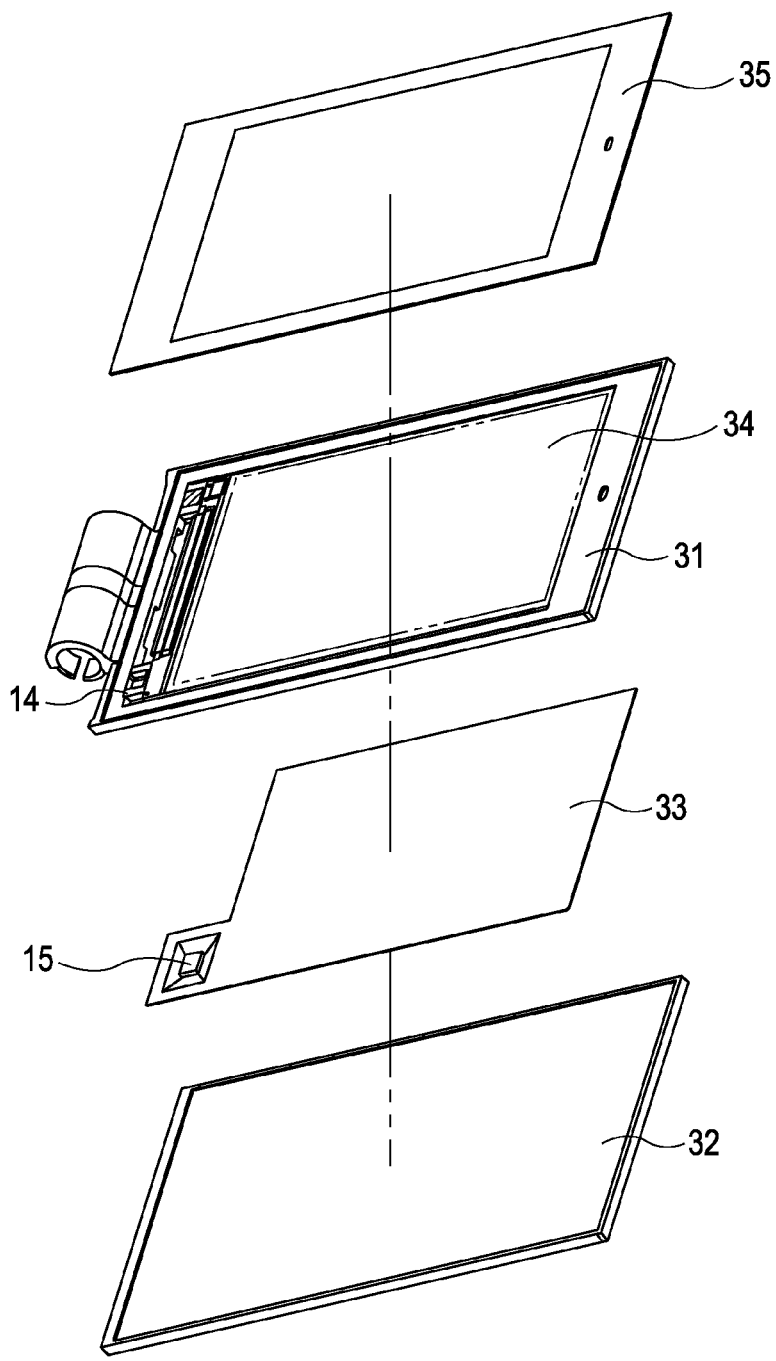
FIG. 9 is a perspective view illustrating the electronic device according to the first embodiment being assembled.
Figure 10:
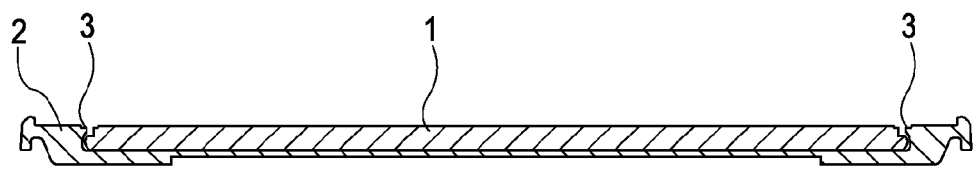
FIG. 10 is a sectional view illustrating a known electronic device.

Next, as illustrated in FIG. 9, the board 33 is fitted into the front case 31 from the back of the front case 31. The decorative panel 35 is attached to the front case 31 with a sealing member (not illustrated) therebetween, from the front of the front case 31. The rear case 32 is attached to the front case 31 with a sealing member (not illustrated) therebetween, from the back of the front case 31. Thus, the assembling of the electronic device 11 is completed.

According to the second embodiment, the same advantage as that of the first embodiment may be obtained.

Examples of the display unit 13 are not limited to a liquid crystal display unit. The stopper 14 may have, for example, such a shape that the electronic component 15 (illuminance sensor) is surrounded on all four sides by the stopper 14 as viewed from the front. The stopper 17 may have, for example, such a shape that the electronic component 18 (magnet) is surrounded on all four sides by the stopper 17 as viewed from the front, and does not necessarily have to have a bottom portion.

Examples of an electronic device are not limited to a cellular phone, and include an electronic computer such as a personal computer, a portable sound recorder and reproducer, an electrical appliance such as a portable TV receiver, and a toy such as a game machine as long as they have a display unit.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:
1. An electronic device comprising:
   a display device;
   a case configured to retain the display device;
   a stopper disposed between an outside edge of the retained display device and an inside edge of the case such that a space between the outside edge of the retained display device and the inside edge of the case is formed, the space having three sides defined by the stopper and a fourth side defined by at least a portion of the inside edge of the case, wherein the three sides that are defined by the stopper and the fourth side that is defined by the at least portion of the inside edge of the case each have a normal direction that is parallel to a viewing surface of the display device; and
   an electronic component housed in the space formed by disposing the stopper, wherein the electronic component is housed in the space such that the electronic component is surrounded by the three sides defined by the stopper and by the fourth side defined by the at least portion of the inside edge of the case.
2. The electronic device according to claim 1, wherein the electronic component includes a sensor sensitive to light and the stopper has a color blocking effect.
3. The electronic device according to claim 1, wherein the electronic component includes a magnet.
4. An electronic device comprising:
   a display device;
   a case including a first space for retaining the display device, the display device being operable to be slid into the first space;
   a stopper disposed in a second space between an outside edge of the retained display device and an inside edge of the case such that a third space between the outside edge of the retained display device and the inside edge of the case is formed, the third space having three sides defined by the stopper and a fourth side defined by at least a portion of the inside edge of the case, wherein the three sides that are defined by the stopper and the fourth side that is defined by the at least portion of the inside edge of the case each have a normal direction that is parallel to a viewing surface of the display device; and
   an electronic device housed in the third space formed by arranging the stopper, wherein the electronic device is housed in the third space such that the electronic device is surrounded by the three sides defined by the stopper and by the fourth side defined by the at least portion of the inside edge of the case.
5. The electronic device according to claim 4, further comprising:
   a wireless communication circuit; and
   a data input device operable by a user,
   wherein the display device is operable to display information in accordance with data received by the wireless communication circuit and to display information in accordance with data inputted by the data input device.
6. A communication device comprising:
   a display device;
   a case configured to retain the display device;
   a stopper disposed between an outside edge of the retained display device and an inside edge of the case such that a space between the outside edge of the retained display device and the inside edge of the case is formed, the space having three sides defined by the stopper and a fourth side defined by at least a portion of the inside edge of the case, wherein the three sides that are defined by the stopper and the fourth side that is defined by the at least portion of the inside edge of the case each have a normal direction that is parallel to a viewing surface of the display device;

an electronic component housed in the space formed by disposing the stopper, wherein the electronic component is housed in the space such that the electronic component is surrounded by the three sides defined by the stopper and by the fourth side defined by the at least portion of the inside edge of the case;

a wireless communication circuit; and a data input device operable by a user, wherein the display device is operable to display information in accordance with data received by the wireless communication circuit and to display information in accordance with data inputted by the data input device.

* * * * *